(12) United States Patent
Irvine et al.

(10) Patent No.: US 6,225,859 B1
(45) Date of Patent: *May 1, 2001

(54) INTEGRATED LOW-PASS FILTER

(75) Inventors: Robert Grant Irvine, Priceton Junction, NY (US); Bernd Kolb, Unterhaching (DE)

(73) Assignee: Infineon Technologies AG, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/152,831

(22) Filed: Sep. 14, 1998

(30) Foreign Application Priority Data

Sep. 12, 1997  (DE) .............................................. 197 40 193

(51) Int. Cl.[7] ....................................................... H03K 5/01
(52) U.S. Cl. ............................................ 327/552; 327/558
(58) Field of Search .................................. 327/551, 552, 327/553, 558, 311, 313, 323, 324

(56) References Cited

U.S. PATENT DOCUMENTS 4,877,979 * 10/1989 Sempel .................................. 327/558
5,293,087 * 3/1994 Hamano et al. ...................... 327/558

FOREIGN PATENT DOCUMENTS 0 663 723 A1    7/1995 (EP) .
62-18813 *      1/1987 (JP) ..................................... 327/552

* cited by examiner

Primary Examiner—Tuan T. Lam
(74) Attorney, Agent, or Firm—Herbert L. Lerner; Laurence A. Greenberg; Werner H. Stemer

(57) ABSTRACT

The integrated low-pass filter has a resistor connected, on the one hand, to an input terminal and, on the other hand, to a first capacitor and to the control terminal of a transistor. The output circuit of the transistor is connected, on the one hand, to the first capacitor and to an output terminal of the circuit. Furthermore, the output circuit of the transistor is also connected, via a current source and a second capacitor, to a first reference potential. On the other end, the output circuit of the transistor is connected to a second reference potential.

8 Claims, 2 Drawing Sheets

US 6,225,859 B1

INTEGRATED LOW-PASS FILTER

BACKGROUND OF THE INVENTION

1. Field of the Invention

The invention is in the field of electronic filters. More specifically, the invention relates to an integrated low-pass filter for damping relatively high-frequency components of a signal (e.g. harmonics).

Multipolar single-stage filters are difficult to implement in integrated bipolar high-frequency circuits. One essential goal is a steep edge dropoff in the amplitude response of the filter toward high frequencies, but without having to have recourse to multistage filter arrays.

In the past, the art has either dispensed with explicit filter action entirely, or else used unipolar filters in the form of RC circuits.

2. Summary of the Invention

It is accordingly an object of the invention to provide an intergrated low-pass filter, which overcomes the above-mentioned disadvantages of the heretofore-known devices and methods of this general type and that has a high selectivity in the depletion range, and an optimized characteristic curve with minimal damping in the conducting range, and that can be integrated in an integrated circuit.

With the foregoing and other objects in view there is provided, in accordance with the invention, an integrated low-pass filter, comprising:

an input terminal, a transistor having a control terminal and an output circuit, and a resistor connected between the input terminal and the control terminal of the transistor;

a first capacitor connected between the resistor and the control terminal of the transistor, on the one hand, and to the output circuit of the transistor, on the other hand;

an output terminal connected to the output circuit of the transistor;

a second capacitor connected between the output terminal and a first reference potential; and a current source connected (in parallel with the second capacitor) between the output terminal and the first reference potential; and the output circuit of the transistor being connected between a second reference potential and, via the current source and the second capacitor the first reference potential.

In accordance with an added feature of the invention, the current source is an adjustable current source. This allows adjusting the operating point of the filter. In addition, the filter can be used as a dual band filter; that is, a switchover between two different frequency bands with correspondingly different filtering is possible. Because of the adjustable current source, the limit frequency (corner frequency) of the low-pass filter is variable, thus making it possible to process a plurality of different fundamental frequencies with a desired constant harmonic damping.

In accordance with an additional feature of the invention, the resistor is a parasitic component of the transistor. This allows a considerable savings in the required chip surface area. Similarly, in accordance with another feature of the invention, the first capacitor is a parasitic component of the transistor.

In accordance with a further feature of the invention, the second capacitor is a parasitic component of the transistor.

In accordance with again an added feature of the invention, the transistor is an npn transistor. Similarly, the transistor may be a pnp transistor that is correspondingly integrated. Alternatively, the transistor is a field effect transistor.

In accordance with a concomitant feature of the invention, there is provided a low pass filter assembly which is formed with a plurality of low-pass filters. The individual filters are connected in cascade fashion, and a buffer amplifier is connected in between and separates the respective low-pass filters.

The invention has the advantage that better selectivity can be attained than when there are two or more cascaded RC members. In addition, unlike with RC members, the useful signal is damped only minimally.

Another advantage of the invention is that especially at intermediate frequencies (100 to 200 MHz), the circuit requires less chip area than conventional embodiments, because when inductances are used they have to be made very large.

Other features which are considered as characteristic for the invention are set forth in the appended claims.

Although the invention is illustrated and described herein as embodied in an integrated low-pass filter, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a circuit diagram of cascaded low-pass filters of FIG. 1 with a buffer amplifier in between; and FIG. 4 is a circuit diagram of cascaded low-pass filters of FIG. 2 with a buffer amplifier in between.

DESCRIPTION OF THE PREFERRED EMBODIMENTS

Figure 1:
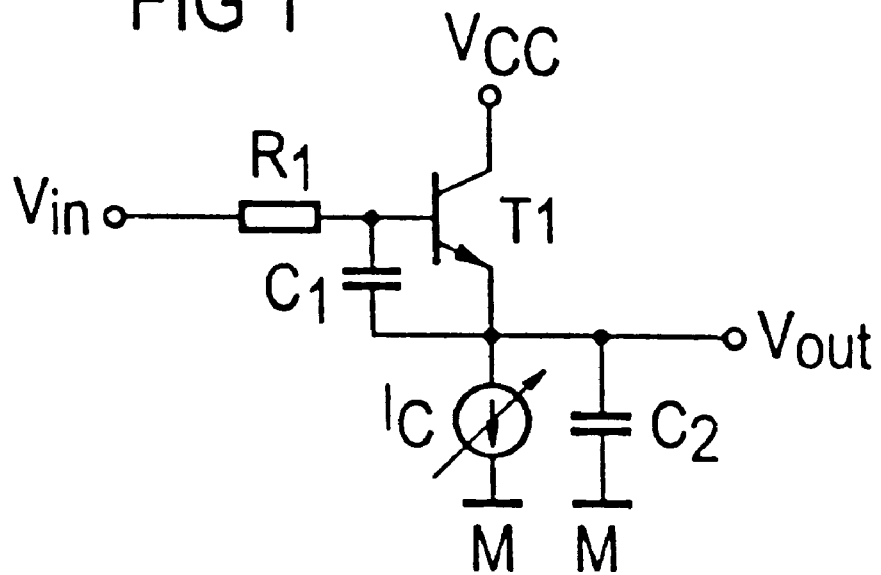
FIG. 1 is a circuit diagram of a first embodiment of the low-pass filter according to the invention.

Referring now to the figures of the drawing in detail and first, particularly, to FIG. 1 thereof, there is seen a low-pass filter with a transistor T1. A collector of the transistor T1 is connected to a reference potential VCC, a base of the transistor T1 is connected to one terminal of a first capacitor C1 and a first resistor R1. An emitter of the transistor T1 is connected to the other terminal of the first capacitor C1, an output terminal $V_{out}$, and, via a first current source IC and a second capacitor C2, a reference potential M. An input terminal $V_{in}$ of the circuit is connected to a second terminal of the resistor R1.

It is possible with the circuit shown in FIG. 1 to make a low-pass filter with an LC characteristic. The low-pass filter of the present circuit has a steeper edge dropoff in the amplitude response toward higher frequencies than a conventional RC low-pass filter.

A source impedance Ze offered by the emitter of the transistor T1 is defined by $$Z_e = \frac{R_1}{\beta} = \frac{R_1}{\beta_0} + j\omega\frac{R_1 C_1}{g_m} = \frac{R_1}{\beta} + j\omega R_1 C_1 \frac{V_T}{I_C}$$

wherein:

β=differential current amplification (dIC:dIB with UCE= constant)

$\beta_o$=direct current amplification $g_m$=direct current admittance of the transistor T1

$V_T$=temperature voltage.

The impedance $Z_e$ has the imaginary component $\omega R_1 C_1 V_T/I_C$.

This can be imagined as being generated by an inductance $$L_e = R_1 C_1 \frac{V_T}{I_C}$$

By the embodiment of the invention, a steeper edge dropoff of the amplitude response of the single-stage filter toward higher frequencies is generated than would be possible with a conventional RC low-pass filter.

Advantageously, the filter circuit can be used as a current-controlled filter. The filter limit frequency can be adjusted steadily or discretely by means of a steady or discrete variation in the bias current that is generated by the current source IC.

Figure 2:
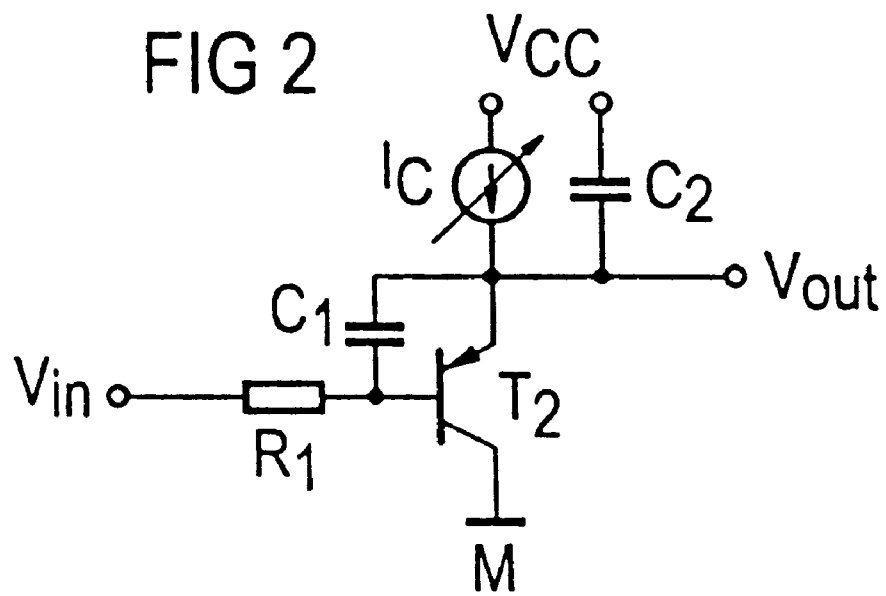
FIG. 2 is a circuit diagram of a second embodiment of the low-pass filter according to the invention.

Referring now to FIG. 2, the filter circuit shown therein differs from that of FIG. 1 in the use of a pnp transistor, instead of an npn transistor as shown in FIG. 1. The base of the transistor T2 of FIG. 2 is connected to both the first terminal of the capacitor C1 and the first terminal of the resistor R1. The second terminal of the resistor R1 is connected to the input terminal $V_{in}$. The collector of the transistor T2 is located at the reference potential M. The emitter of the transistor T2 is connected to the second terminal of the first capacitor C1, the output terminal $V_{out}$, and via the current source IC and the second capacitor C2 to the reference potential VCC.

The circuit shown in FIG. 2 is equivalent in function to the circuit shown in FIG. 1.

It will be understood by those skilled in the art that corresponding field effect transistors may also be provided instead of the npn transistor T1 or the pnp transistor T2.

In general, it is true that the greater the current generated by the current source IC, the higher the filter limit frequency becomes, and the smaller the imaginary component of the source impedance Ze becomes.

The resistor R1 and the two capacitors C1 and C2 serve to dimension the circuit. Depending on the desired frequency characteristic, the resistor R1 and the two capacitors C1 and C2 can optionally be realized by means of the parasitic effects of the transistor.

Figure 3:
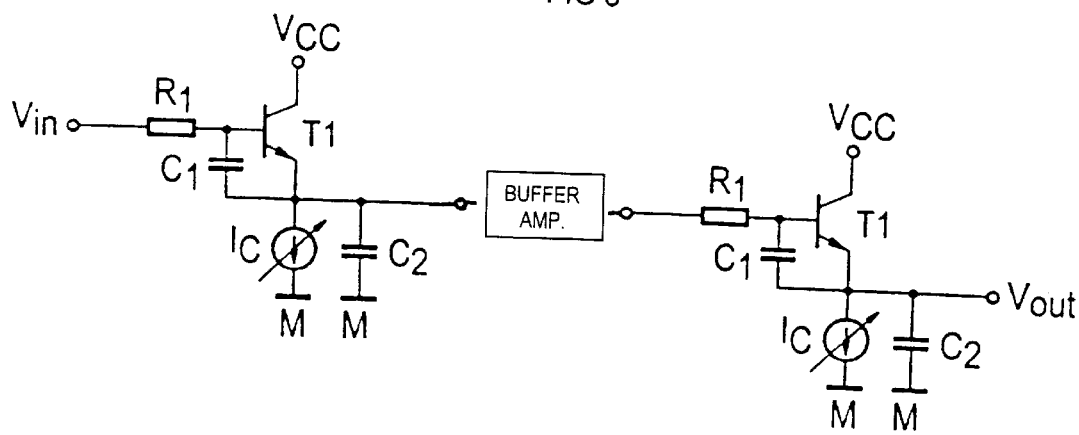
Figure 4:
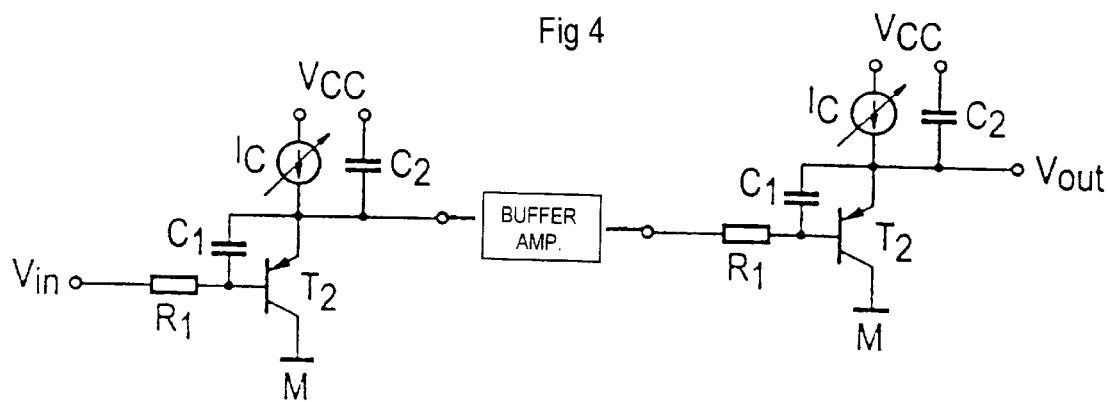

The exemplary embodiments shown in FIGS. 1 and 2 can also be cascaded as shown in FIGS. 3 and 4. To that end, a respective buffer amplifier with high input impedance should be connected between the individual filter stages, in order to prevent the first filter stage from being loaded by the following filter stage.

The circuit configuration of the invention can be used especially advantageously at frequencies between 100 and 200 MHz, because—in comparative terms—the inductive component for a corresponding LC circuit would be very large. Thus surface area on the integrated circuit can be saved by means of the circuit configuration of the invention.

Damping of 40 dB per decade can be attained with the circuit of the invention.

We claim:

1. An integrated low-pass filter, comprising:

a filter input terminal;

a transistor having a control terminal, an output terminal, a transistor terminal, and a source impedance;

a resistor connected between said input terminal and said control terminal of said transistor;

a first capacitor connected between said resistor and said control terminal of said transistor on one hand and to said output terminal of said transistor on the other hand;

a filter output terminal connected to said output terminal of said transistor;

a second capacitor connected between said filter output terminal and a first reference potential; and an adjustable current source connected between said filter output terminal and the first reference potential, said transistor terminal of said transistor being connected to a second reference potential, said source impedance defined by the equation:

$$Z_e = \frac{R_1}{\beta} + j\omega R_1 C_1 \frac{V_T}{I_C}$$

where:

$R_1$=resistance of said resistor;

β=differential current amplification;

$C_1$=capacitance of said first capacitor;

$V_T$=temperature voltage; and $I_C$=current generated by said adjustable current source.

2. The low-pass filter according to claim 1, wherein said resistor is a parasitic component of said transistor.

3. The low-pass filter according to claim 1, wherein said first capacitor is a parasitic component of said transistor.

4. The low-pass filter according to claim 1, wherein said second capacitor is a parasitic component of said transistor.

5. The low-pass filter according to claim 1, wherein said transistor is an npn transistor.

6. The low-pass filter according to claim 1, wherein said transistor is a pnp transistor.

7. The low-pass filter according to claim 1, wherein said transistor is a field effect transistor.

8. A low pass filter assembly, comprising: a plurality of low-pass filters, each according to claim 1, connected in cascade fashion, and a buffer amplifier connected in between and separating respective two low-pass filters.

* * * * *